United States Patent

[11] 3,572,865

[72] Inventor Alfonso S. Attardi
Batavia, N.Y.
[21] Appl. No. 826,350
[22] Filed May 21, 1969
[45] Patented Mar. 30, 1971
[73] Assignee Sylvania Electric Products Inc.

[54] TELEVISION CHASSIS SLIDE MOUNTING
7 Claims, 6 Drawing Figs.

[52] U.S. Cl. .......... 312/7
[51] Int. Cl. .......... A47b 81/06, H05k 5/00
[50] Field of Search .......... 312/7

[56] References Cited
UNITED STATES PATENTS

| | | | |
|---|---|---|---|
| 2,413,922 | 1/1947 | Jensen et al. | 312/7 |
| 2,486,764 | 11/1949 | Singer | 312/7 |
| 2,980,478 | 4/1961 | Woehrle | 312/7 |

*Primary Examiner*—Patrick D. Lawson
*Attorneys*—Norman J. O'Malley, Donald R. Castle, Thomas H. Buffton and Edward J. Coleman

ABSTRACT: A slide mounting for supporting a television chassis in a cabinet and enabling partial withdrawal or complete removal of the chassis for servicing. The mounting comprises a pair of outer members affixed to the cabinet and a pair of inner members attached to opposite ends of the chassis and each having a tongue portion slidably engaging a groove in the corresponding outer member. A spring latch flexibly mounted on each outer member locks the chassis in a normal operating position by engaging a first notch in the corresponding inner member tongue portion. For servicing, the spring latches are manually deflected to disengage the first set of tongue notches, and the chassis is withdrawn until locked in a service position by the spring latches engaging a second set of tongue notches. Complete removal of the chassis is facilitated by deflecting the latch springs sufficiently to engage step portions in the outer members.

INVENTOR.
ALFONSO S. ATTARDI

BY

Donald R. Castle
ATTORNEY

INVENTOR.
ALFONSO S. ATTARDI

BY

Donald R. Castle

ATTORNEY

TELEVISION CHASSIS SLIDE MOUNTING

BACKGROUND OF THE INVENTION

This invention relates to electrical chassis mounting constructions and, more particularly, to a simplified slide mounting for supporting a chassis within a cabinet and facilitating partial withdrawal or complete removal of the chassis for convenient inspection and repair.

The invention is found particularly useful and advantageous for the mounting of printed circuit chassis panels in television receivers. Conventionally, such chassis have been supported in a cabinet by the use of various brackets and a plurality of bolts and screws, obviously making removal for servicing quite inconvenient and time consuming. Further, a fixed mounting of this type makes the testing of chassis circuitry in an operating receiver an extremely awkward procedure. An alternative method of chassis mounting, which has been used to facilitate the maintenance of large racks of complex electronic equipment intended for government and industrial use, is to employ extendable slide mechanisms, such as those described by U.S. Pats. No. 2,728,626 and No. 3,146,048. Such slide mechanisms typically comprise two or three telescoping channels mounted on a track and include complex rod, spring, lever and pin linkages to provide a multiple position locking capability operable from the front panel of the chassis drawer. To further facilitate inspection and repair, detent mechanisms are provided for tilting the chassis to various positions. Although practicable and useful for the maintenance of large scale racks of expensive electronic equipment, it is quite apparent that such prior art slide mechanisms are much too cumbersome, complex and costly for use in a commercial television receiver.

OBJECTS AND SUMMARY OF THE INVENTION

With an awareness of the aforementioned disadvantages of the prior art, it is an object of the present invention to provide an improved electrical chassis mounting construction which will facilitate convenient accessibility for testing and repair.

It is another object of the invention to provide a simplified and compact chassis slide mounting which may be conveniently locked in a plurality of positions or completely removed for servicing.

Briefly, these and other objects are attained in one aspect of the invention by a slide mounting comprising an outer member, which is affixed to a cabinet, and a notched inner member, which is attached to the chassis and slidably engages the outer member. A spring latch is flexibly mounted on the outer member and adapted to normally engage one of a plurality of notches in the inner member. A handle on the spring facilitates deflection thereof to disengage the latch.

BRIEF DESCRIPTION OF THE DRAWINGS

This invention will be more fully described hereinafter in conjunction with the accompanying drawings, in which.

DESCRIPTION OF THE PREFERRED EMBODIMENT

For a better understanding of the present invention, together with other and further objects, advantages and capabilities thereof, reference is made to the following disclosure and appended claims in connection with the above-described drawings.

Figure 1:
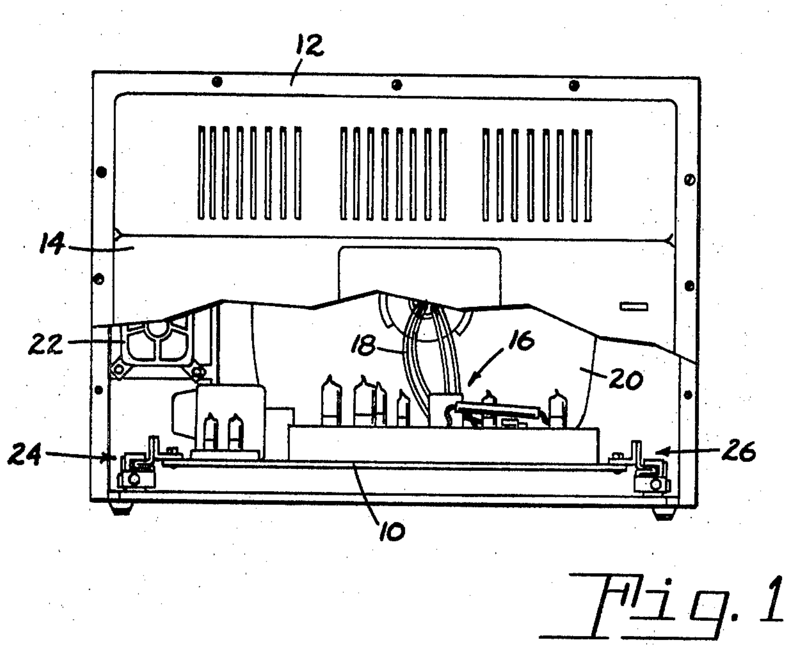
FIG. 1 is a rear elevational view of a television cabinet with the back cover cutaway to show a pair of slide mountings supporting a chassis panel in accordance with the invention.

FIG. 1 illustrates a television receiver incorporating the invention to support a printed circuit chassis panel 10 within a cabinet 12, the cabinet back cover 14 having been partially cutaway. Various electrical components 16 are mounted on the chassis panel 10 and connected via leads 18 to a picture tube 20, and a speaker 22 is mounted to one side of the cabinet front panel. Left and right-hand slide mountings 24 and 26, in accordance with the invention, are shown disposed in substantially parallel relationship on the bottom shelf of the cabinet 12 for supporting opposite ends of the chassis panel 10.

Figure 2:
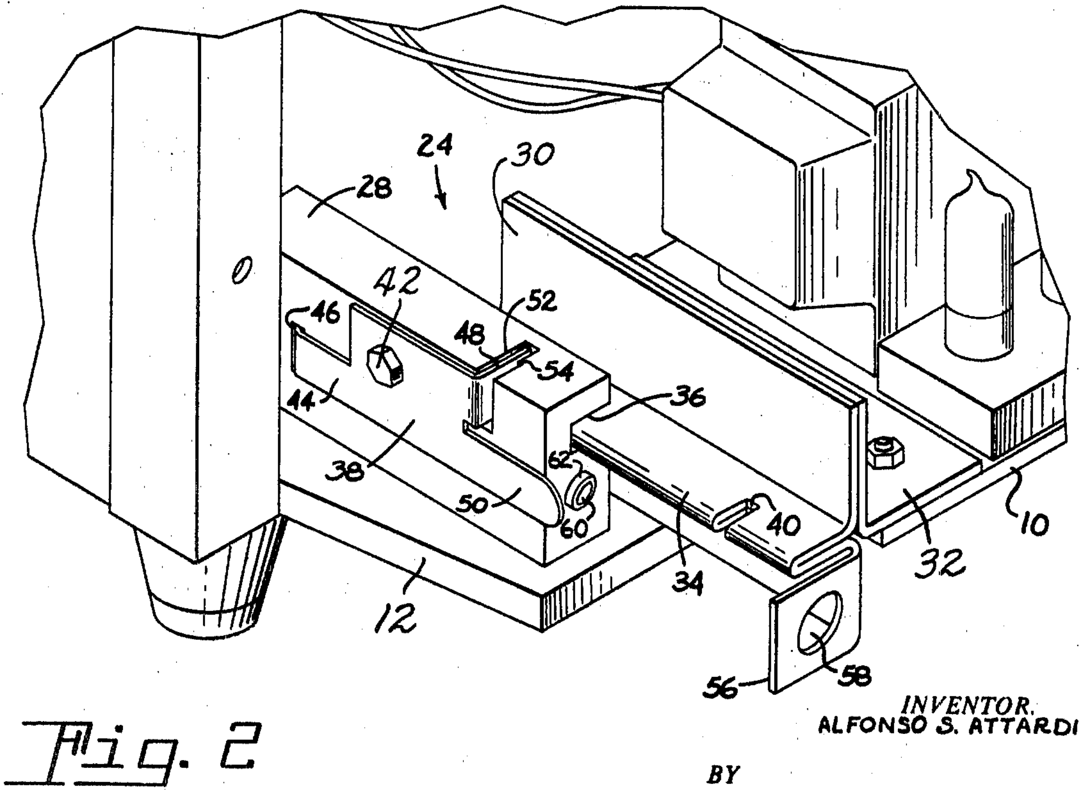
FIG. 2 is a partial isometric view showing the left-hand slide mounting of FIG. 1 with the chassis in a partially withdrawn position.

An enlarged isometric view of the left-hand slide mounting 24 is shown in FIG. 2 with the chassis panel 10 in a partially withdrawn position. In accordance with the invention, this slide mounting comprises an outer member 28 affixed to the bottom shelf of the cabinet 12, by means not shown, and a slidably engaging inner member 30 attached to the chassis 10 by means of an L bracket 32. The inner member 30 is formed to have a tongue portion 34 which slidably engages a longitudinally extending groove 36 in the outer member 28. Preferably, the outer member 28 is composed of an insulating material so as to electrically isolate the chassis panel 10 and the inner member 30 from the cabinet 12.

Multiple position locking of the chassis is provided by means of a spring latch 38 flexibly mounted on the side of the outer member 28 and adapted to normally engage one of a plurality of notches 40 in the tongue portion 34 of the inner member 30. More specifically, the spring latch 38 comprises a flat spring which is mounted by a single screw 42 on the side of the outer member 28 opposite that containing the groove 36. The spring latch 38 includes a locator portion 44 which engages a slot 46 in the outer member 28, a tab 48 bent to project toward the inner member 30, and a handle 50 to facilitate deflection of the spring latch 38. Outer member 28 contains a slot 52 extending into the groove 36 from the side upon which the spring latch 38 is positioned whereby the tab 48 passes through the slot 52 to engage a notch 40 in the tongue portion 34 of the inner member 30. Hence, the spring latch 38 is arranged to normally urge the tab 48 into engagement with one of the tongue notches 40, and the handle 50 enables deflection of the spring latch 38 so as to disengage the tab 48 from the tongue notch 40 and thereby facilitate slidable movement of the chassis 10. To facilitate complete removal of the chassis panel 10, the outer member slot 52 is provided with a step 54 located whereby sufficient deflection of the spring latch 38 urges the tab 48 into engagement with the step 54 whereupon the step 54 retains the tab 48 clear of the tongue portion 34.

As a further feature of the invention, the inner member 30 has a tab 56 bent at a right angle at the rear of the chassis panel 10 to function as a stop for the chassis panel 10 in event of failure of the spring latch 38. In addition, the tab 56 contains a hole 58 in alignment with a hole 60 in the outer member 28 facing the rear of the cabinet 12 to accommodate a mounting screw for attaching the back cover 14. An insulating boss 62 formed about the hole 60 is adapted to engage the tab 56 so as to electrically isolate a back cover mounting screw from the tab 56 when the chassis panel 10 is fully inserted.

Figure 3:
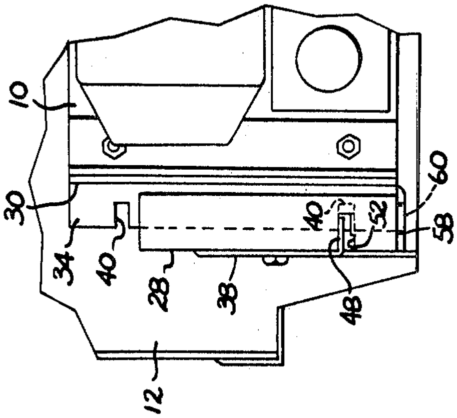

Operation of the slide mounting shown in FIG. 2 will now be described with reference to the downward looking plan views of FIGS. 3—5 and the perspective view of FIG. 6. As is apparent from the drawings, the inner member 30 of the illustrated embodiment of the invention contains two of the notches 40, one to facilitate locking the chassis in a normal operating position and the other for locking the chassis in a partially withdrawn or service position. FIG. 3 shows the chassis panel 10 fully inserted within the cabinet 12 in the normal operating position. In this position, as illustrated, the tab 48 is urged by the spring latch 38 through the outer member slot 52 into engagement with the notch 40 toward the rear of inner member tongue 34, thereby locking the chassis panel 10 into the cabinet 12 for normal operation of the television receiver. In the case of commercial television receivers, this feature of locking the chassis panel 10 into the "in," or normal position, is particularly desirable in order to meet Underwriter's Laboratories requirements. Momentarily referring also to FIG. 2, the plan view of FIG. 3 illustrates how, when the chassis is in the "in" position, a back cover may be attached by means of a screw through a mounting hole therein and the aligned holes 58 and 60 in the slide mounting. In this manner, the back cover serves as a redundant means to lock the chassis in the "in" position by the retaining inner member tab 56 between the back cover and the back end of the outer member 28.

Figure 4:
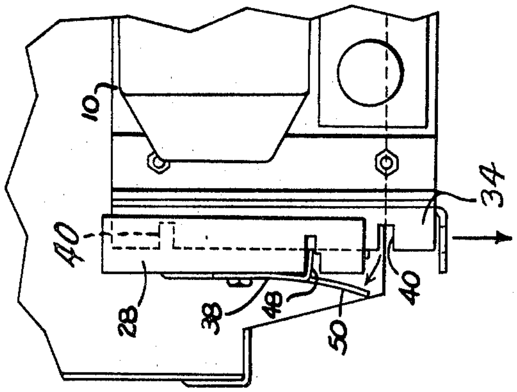

In order to withdraw the chassis panel 10 to the service position, the spring latch 38 is deflected sufficiently to disengage the tab 48 from the notch 40, as shown in FIG. 4, by manually applying force to the handle 50 in the direction of the arrow. While holding the handle 50, the chassis panel 10 may be pulled out sufficiently to clear at least one of the notches 40. Then, as the tab 48 rides on the edge of the tongue 34, the chassis panel 10 may be further withdrawn until the travel of the tongue portion 34 and the spring tension on the spring latch 38 result in the tab 48 automatically snapping into engagement with the notch 40 toward the front end of the inner member tongue 34, as shown in FIG. 5.

Figure 5:
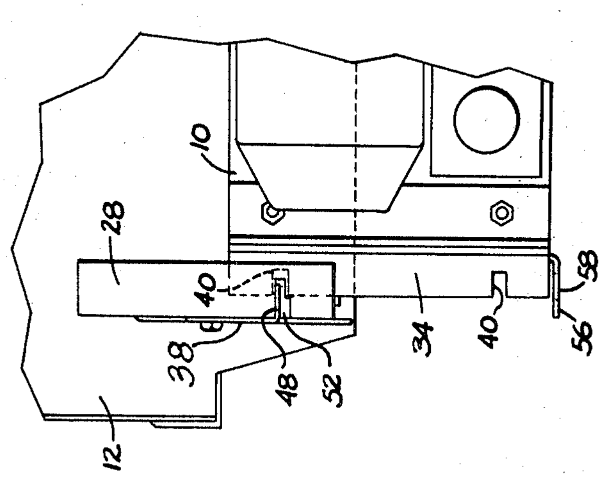
FIGS. 3—5 are plan views looking down on the slide mountings of FIG. 2 and showing the chassis in various positions.

FIG. 5 illustrates the chassis panel 10 locked in the service position whereby both the top and bottom sides of the chassis panel 10 are conveniently accessible for testing or adjustment while the television receiver is operating. Of course, prior to withdrawing the chassis panel 10, the back cover 14 and front panel knobs must be removed, and to enable continued energization of the receiver in the service position, all leads 18 connecting the chassis circuitry to the picture tube 20, speaker 22 and other components not mounted on the chassis must be of sufficient length.

Figure 6:
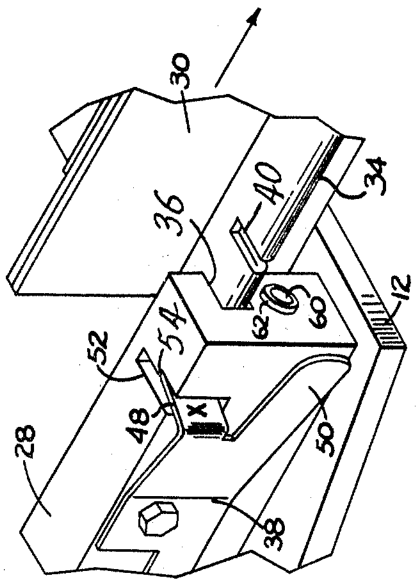
FIG. 6 is a partial perspective view of the FIG. 2 slide mounting showing the spring latch retained in a neutral position to permit complete removal of the chassis.

In the event it is desired to completely remove the chassis from the cabinet for servicing, the spring latch 38 is deflected sufficiently to cause the tab 48 to engage the step 54 in the outer member slot 52, as shown in FIG. 6. In this manner, the tab 48 is held clear of the tongue portion 34 so that the chassis panel 10 and the inner member 30 may be easily withdrawn from the outer member groove 36. Of course, engagement of the tab 48 in a neutral position on the step 54 also facilitates insertion of the chassis panel 10 and tongue portion 34 into the outer member groove 36. To remove the tab 48 from the step 54, and thereby return the tab 48 to its active position, a force is applied to the tab 48 at point X.

The construction and operation of the right hand slide mounting 26 (FIG. 1) is, of course, identical to that of the left-hand slide mounting except for being adapted to a right-hand orientation. Hence, the overall slide mounting for the chassis panel 10 may be described as comprising a pair of outer members 28 affixed to the cabinet 12 and a pair of inner members 30 attached to opposite ends of the chassis panel 10, each having a tongue portion 34 slidably engaging a groove 36 in the corresponding outer member 28. Spring latches 38 flexibly mounted on the outer members 28 lock the chassis panel 10 into a normal operating position by engaging a first set of notches 40 in the inner member tongues 34. For servicing, both spring latches 38 are manually deflected to disengage the first set of tongue notches 40, and the chassis panel 10 is withdrawn until locked in the service position by the spring latches 38 engaging a second set of tongue notches 40. Complete removal of the chassis panel 10 is then facilitated by deflecting both of the spring latches 38 sufficiently to engage the step portions 54 in the outer members 28.

It is apparent from the foregoing description that the present invention provides a multiple position locking slide which is quite simple, inexpensive and compact, especially in comparison with the denoted prior art. As a consequence, the concept of slide out chassis mounting is made feasible and advantageous for use in commercial television receivers to provide a valuable ease of servicing feature. It is to be understood, however, that the invention is not limited to use in television receivers, but may be employed in a wide variety of chassis mounting application. Further, it is contemplated that the spring latch 38 and inner member 30 may be embodied in a variety of configurations to perform the same functions; the invention may be practiced without the use of the slot 52 and without a groove 36 of the particular shape shown; the outer member 28 may be a formed or molded portion of the cabinet 12; the chassis panel 10 may be attached directly to the inner member 30 rather than via the L bracket 32; and if the application warrants, each of the inner member tongue portions 34 may have intermediate notches 40 to provide more than the two chassis positions shown.

While there has been shown and described what is at present considered the preferred embodiment of the invention it will be obvious to those skilled in the art that various changes and modifications may be made therein without departing from the scope of the invention as defined by the appended claims.

I claim:

1. A slide mounting for supporting a chassis within a cabinet comprising in combination:

an inner member affixed to a chassis and having a plurality of notches; and an outer member fixedly attached to a cabinet and in slidable engagement with said inner member, said outer member having a latch member flexibly attached for engagement and disengagement with said notches of said inner member.

2. The combination of claim 1 wherein said inner member includes a tongue portion including said plurality of notches and said outer member is formed to provide a groove wherein said tongue portion is slidably engaged.

3. The combination of claim 2 wherein said latch member of said outer member is in the form of a flexible spring having a tab extending toward said inner member and arranged to urge said tab into engagement with a notch of said tongue member.

4. The combination of claim 2 wherein said latch member is flexibly attached to said outer member on a side opposite from the side thereof formed to provide a groove, said outer member includes a slot having a step portion and extending into said groove from said side opposite thereto, and said latch member includes a tab formed to extend through said slot and engage a notch of said tongue portion of said inner member and to engage said step portion of said slot in accordance with the amount of deflection of said latch member whereby said latch member may be deflected for engagement with a notch of said tongue portion of said inner member to secure said chassis or with said step portion of said outer member to permit freedom of slidable movement of said inner member and said chassis.

5. The combination of claim 2 wherein said outer member includes a hole having a boss of electrical insulating material and facing the rear of said cabinet, and said inner member includes a tab extending outwardly at a right angle to the rear of the chassis and having a hole for alignment with the hole having a boss of said outer member, and means for engaging said holes of said inner and outer members to effect attachment therebetween.

6. The combination of claim 2 wherein said latch member of said outer member includes a protuberance projecting toward said inner member and arranged for effecting engagement of said protuberance with a notch of said tongue member.

7. The combination of claim 2 wherein said outer member includes a hole facing the rear of said cabinet, said inner member includes a tab having a hole therein, and means for utilizing said holes to effect alignment and engagement of said outer and inner members and attachment therebetween.